(12) United States Patent
Qu

(10) Patent No.: US 11,114,474 B2
(45) Date of Patent: Sep. 7, 2021

(54) THIN FILM TRANSISTOR, MANUFACTURING METHOD THEREOF, ARRAY SUBSTRATE, AND DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventor: Lianjie Qu, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 635 days.

(21) Appl. No.: 16/074,266

(22) PCT Filed: Dec. 15, 2017

(86) PCT No.: PCT/CN2017/116589
§ 371 (c)(1),
(2) Date: Jul. 31, 2018

(87) PCT Pub. No.: WO2018/214485
PCT Pub. Date: Nov. 29, 2018

(65) Prior Publication Data
US 2021/0210528 A1 Jul. 8, 2021

(30) Foreign Application Priority Data
May 26, 2017 (CN) .......................... 201710386619.4

(51) Int. Cl.
*H01L 27/12* (2006.01)

(52) U.S. Cl.
CPC ...... *H01L 27/1262* (2013.01); *H01L 27/1218* (2013.01); *H01L 27/1237* (2013.01)

(58) Field of Classification Search
CPC ............. H01L 27/1262; H01L 27/1218; H01L 27/1237
See application file for complete search history.

(56) References Cited

U.S. PATENT DOCUMENTS 8,604,470 B2 * 12/2013 Yim .................. H01L 29/78693
257/43
9,825,060 B2 11/2017 Sasaki
(Continued)

FOREIGN PATENT DOCUMENTS

| CN | 101424846 A | 5/2009 |
| CN | 103022150 A | 4/2013 |

(Continued)

OTHER PUBLICATIONS

Chinese Office Action in corresponding Chinese Application No. 201710386619.4 dated Jul. 30, 2019 (an English translation attached hereto). 22 pages.
(Continued)

*Primary Examiner* — David Vu
(74) *Attorney, Agent, or Firm* — Leason Ellis LLP

(57) ABSTRACT

A thin film transistor (TFT), a manufacturing method thereof, an array substrate and a display panel are disclosed. The manufacturing method includes: providing a base substrate; forming a first electrode, an isolating layer, an active layer and a gate insulating layer on the base substrate; simultaneously forming a second electrode and a gate electrode, wherein the second electrode is connected to the active layer.

20 Claims, 8 Drawing Sheets

(56) References Cited

U.S. PATENT DOCUMENTS

2014/0175434 A1    6/2014   Yuan
2016/0225914 A1    8/2016   Zhang et al.

FOREIGN PATENT DOCUMENTS

| CN | 103311310 | A | 9/2013 |
| CN | 105576015 | A | 5/2016 |
| CN | 106298879 | A | 1/2017 |
| CN | 107221501 | A | 9/2017 |
| JP | 2014195077 | A | 10/2014 |
| KR | 1020020037417 | A | 5/2002 |

OTHER PUBLICATIONS

Yeom et al. "60-3: Distinguished Paper: Oxide Vertical TFTs for the Application to the Ultra High Resolution Display." SID Symposium Digest of Technical Papers. vol. 47. No. 1. 2016. 820-822.
International Search Report and Written Opinion in corresponding International Patent Application No. PCT/CN2017/116589 dated Mar. 14, 2018. 17 pages.

\* cited by examiner

S1 — Forming a first electrode, an isolating layer, an active layer and a gate insulating layer on a base substrate S2 — Simultaneously forming a second electrode and a gate electrode the second electrode is connected to the active layer

THIN FILM TRANSISTOR, MANUFACTURING METHOD THEREOF, ARRAY SUBSTRATE, AND DISPLAY PANEL The present invention is a U.S. National Stage Application under 35 U.S.C. § 371 of International Patent Application No. PCT/CN2017/116589, filed Dec. 15, 2017, which claims the benefit of Chinese patent application No. 201710386619.4, which was filed with the SIPO on May 26, 2017, both of which are fully incorporated herein by reference as part of this application.

TECHNICAL FIELD

Embodiments of the present disclosure provide a thin film transistor, a manufacturing method thereof, an array substrate and a display panel.

BACKGROUND

Thin film transistor liquid crystal display (TFT-LCD) and Active matrix organic light-emitting diode (AMOLED) have been more and more applied in the field of high-performance display for their advantages such as small size, low power consumption, zero radiation and low manufacturing cost. A main structure of the TFT-LCD includes an array substrate and a color filter substrate which are assembled with each other to form a cell. The array substrate usually includes a plurality of pixel units arranged in matrix, and the pixel units are defined by multiple gate lines and multiple data lines which are vertically intersected. A thin film transistor (TFT) is disposed at a location where the gate line is intersected with the gate line. A structure of the AMOLED is mainly consisted of a TFT and an OLED.

SUMMARY

An embodiment of the present disclosure provides a manufacturing method of a thin film transistor, including: providing a base substrate; forming a first electrode, an isolating layer, an active layer and a gate insulating layer on the base substrate; and simultaneously forming a second electrode and a gate electrode, wherein the second electrode is connected to the active layer.

For example, in the manufacturing method of a thin film transistor provided by an embodiment of the present disclosure, the isolating layer is formed on the first electrode so that the first electrode is insulated from the second electrode.

For example, in the manufacturing method of a thin film transistor provided by an embodiment of the present disclosure, an orthographic projection of the isolating layer on the base substrate has a width smaller than a width of an orthographic projection of the first electrode on the base substrate, and a side of the isolating layer adjacent to the active layer exposes a part of a surface of the first electrode.

For example, in the manufacturing method of a thin film transistor provided by an embodiment of the present disclosure, the active layer is formed on the isolating layer, and the active layer includes a first portion and a second portion, wherein the first portion is disposed on the isolating layer, and the second portion is disposed on the base substrate and is connected to the part of the surface of the first extrude which is exposed.

For example, in the manufacturing method of a thin film transistor provided by an embodiment of the present disclosure, the gate insulating layer is formed to cover at least part of the active layer and the gate electrode.

For example, in the manufacturing method of a thin film transistor provided by an embodiment of the present disclosure, the gate insulating layer is formed to cover the first electrode and the isolating layer; the gate insulating layer is provided with a via hole through which the second electrode is connected to the active layer.

For example, in the manufacturing method of a thin film transistor provided by an embodiment of the present disclosure, a side of the gate insulating layer close to the isolating layer exposes a part of a surface of the active layer, and the second electrode is in direct contact with the part of the surface of the active layer which is exposed.

For example, in the manufacturing method of a thin film transistor provided by an embodiment of the present disclosure, simultaneously forming a second electrode and a gate electrode includes: forming a second metallic film on the gate insulating layer and the active layer; forming the second electrode and the gate electrode located in a same layer by a single patterning process.

For example, in the manufacturing method of a thin film transistor provided by an embodiment of the present disclosure, an orthographic projection of the second electrode on the base substrate is at least partly overlapped with an orthographic projection of the first electrode on the base substrate; an orthographic projection of the gate electrode on the base substrate is at least partly overlapped with an orthographic projection of the active layer on the base substrate; and the orthographic projection of the gate electrode on the base substrate is partly overlapped with the orthographic projection of the second electrode on the base substrate.

For example, in the manufacturing method of a thin film transistor provided by an embodiment of the present disclosure, an orthographic projection of an edge of the gate electrode close to the second electrode on the base substrate is substantially overlapped with an orthographic projection of an edge of the second electrode close to the gate electrode on the base substrate.

For example, in the manufacturing method of a thin film transistor provided by an embodiment of the present disclosure, the first electrode and the isolating layer are formed by a same, single patterning process.

For example, in the manufacturing method of a thin film transistor provided by an embodiment of the present disclosure, the data line, the first electrode and the isolating layer are formed by a same process, including: forming a first metallic film and an organic film on the base substrate; exposing, in a stepped mode, and developing the organic film by using a halftone mask or a grey tone mask to form an unexposed area at a location to be formed with the first electrode, to form a partly exposed area at a location to be formed with the data line, and to form a completely exposed area at the remaining location; removing the first metallic film in the completely exposed area by etching so as to form the first electrode and the data line; and removing the organic film in the partly exposed area and the organic film in the unexposed area by ashing, so as to form the isolating layer.

For example, in the manufacturing method of a thin film transistor provided by an embodiment of the present disclosure, the isolating layer has a thickness in the range of 0.5 μm~2.0 μm.

For example, the manufacturing method of a thin film transistor provided by an embodiment of the present disclosure further includes: forming a buffer layer on the base substrate, wherein the buffer layer is located between the first electrode and the base substrate.

An embodiment of the present disclosure further provides a thin film transistor, including: a first electrode disposed on a base substrate; an isolating layer disposed on the first electrode and configured to insulate the first electrode from a second electrode; an active layer electrically connected to the first electrode; a gate insulating layer configured to cover at least part of the active layer; a second electrode electrically connected to the active layer; and a gate electrode disposed on the gate insulating layer and located in a same layer with the second electrode.

For example, in the thin film transistor provided by an embodiment of the present disclosure, the gate insulating layer is configured to further cover the first electrode and the isolating layer; the gate insulating layer is provided with a via hole through which the second electrode is connected to the active layer.

For example, in the thin film transistor provided by an embodiment of the present disclosure, a side of the gate insulating layer close to the isolating layer exposes a part of a surface of the active layer, and the second electrode is in direct contact with the part of the surface of the active layer which is exposed.

For example, in the thin film transistor provided by an embodiment of the present disclosure, an orthographic projection of the isolating layer on the base substrate has a width smaller than a width of an orthographic projection of the first electrode on the base substrate, a side of the isolating layer adjacent to the active layer exposes a part of a surface of the first electrode, and the active layer is connected to the part of the surface of the first electrode which is exposed.

For example, in the thin film transistor provided by an embodiment of the present disclosure, the active layer includes a first portion and a second portion, wherein the first portion is disposed on the isolating layer, and the second portion is disposed on the base substrate and is connected to the part of the surface of the first electrode which is exposed from the isolating layer.

For example, in the thin film transistor provided by an embodiment of the present disclosure, the isolating layer has a thickness in the range of 0.5 μm~2.0 μm.

For example, in the thin film transistor provided by an embodiment of the present disclosure, an orthographic projection of the second electrode on the base substrate is at least partly overlapped with an orthographic projection of the first electrode on the base substrate; an orthographic projection of the gate electrode on the base substrate is at least partly overlapped with an orthographic projection of the active layer on the base substrate; and the orthographic projection of the gate electrode on the base substrate is partly overlapped with the orthographic projection of the second electrode on the base substrate.

For example, in the thin film transistor provided by an embodiment of the present disclosure, an orthographic projection of an edge of the gate electrode close to the second electrode on the base substrate is substantially overlapped with an orthographic projection of an edge of the second electrode close to the gate electrode on the base substrate.

For example, the thin film transistor provided by an embodiment of the present disclosure further includes a buffer layer, and the buffer layer is disposed between the base substrate and the first electrode.

An embodiment of the present disclosure further provides an array substrate including any of the thin film transistors provided by the embodiments of the present disclosure.

An embodiment of the present disclosure further provides a display panel including any of the array substrates provided by the embodiments of the present disclosure.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

DETAILED DESCRIPTION

Figures 1, 2:
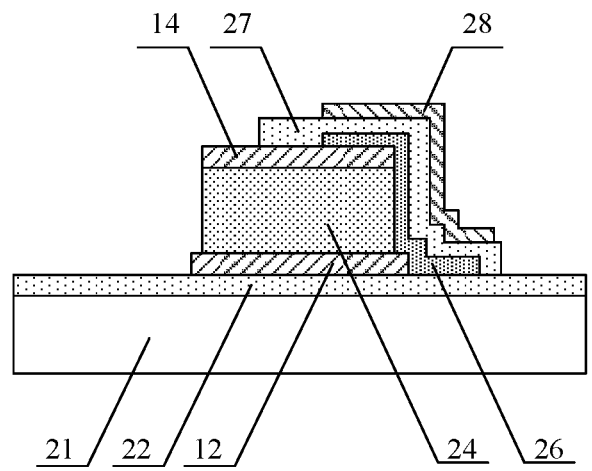
FIG. 1 is a structural diagram illustrating a vertical type thin film transistor.
FIG. 2 is a flow chart illustrating a manufacturing method of a thin film transistor provided by an embodiment of the present disclosure.

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at least one. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not intended to define a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

In accompanying drawings for illustrating the embodiment(s) of the present disclosure, a thickness of a layer or area may be enlarged or narrowed, that is, the drawings are not drawn in a real scale. The accompanying drawings of the present disclosure involve only the structure(s) in connection with the embodiment(s) of the present disclosure, and other structure(s) can be referred to common design(s).

Recently, the high resolution display panel has gradually become the development trend in the industry. Pixels per inch (PPI) of the display panel is related to a pixel aperture ratio of the array substrate, and the pixel aperture ratio is related to a size of a thin film transistor (TFT) in each pixel unit in such a manner that, the greater the area occupied by the TFT is, the smaller the pixel aperture ratio and the resolution of the display panel will be. For this end, a vertical type TFT is proposed to increase the pixel aperture ratio by reducing the size of the TFT, thereby improving the resolution of the display panel.

FIG. 1 is a structural diagram illustrating a vertical type TFT. As illustrated in FIG. 1, the vertical type TFT includes: a buffer layer 22 disposed on a base substrate 21; a source electrode 12 disposed on the buffer layer 22; a spacer layer 24 disposed on the source electrode 12; a drain electrode 14 disposed on the spacer layer 24; an active layer 26 disposed on the drain electrode 14 and the source electrode 12; a gate insulating layer 27 covering the active layer 26; and a gate electrode 28 disposed on the gate insulating layer 27. The active layer 26 is formed at a side of the spacer layer 24, and is electrically connected to the drain electrode 14 and the source electrode 12.

A manufacturing process of the above-mentioned vertical type TFT includes: forming the buffer layer 22 and the source electrode 12 by a first patterning process; forming the spacer layer 24 by a second patterning process; forming the drain electrode 14 by a third patterning process; forming the active layer 26 by a fourth patterning process; forming the gate insulating layer 27 by a fifth patterning process; and forming the gate electrode 28 by a sixth patterning process.

As it can be seen from the structure and the manufacturing process of this vertical type TFT, total six patterning processes are required because there are seven film layers in the TFT with such structure, which not only results in complicated process steps but also leads to low production efficiency and high manufacturing cost; furthermore, a superposition of errors from multiple patterning processes may affect the alignment accuracy, resulting in poor product yield.

In order to solve the defects in the manufacturing method of vertical type TFT that the process steps are complicated and the alignment accuracy is poor, an embodiment of the present disclosure provides a vertical type TFT and a manufacturing method thereof.

An embodiment of the present disclosure provides a manufacturing method of a thin film transistor (TFT), including: providing a base substrate; forming a first electrode, an isolating layer, an active layer and a gate insulating layer on the base substrate; and simultaneously forming a second electrode and a gate electrode; wherein the second electrode is connected to the active layer.

An embodiment of the present disclosure further provides a TFT, including: a first electrode disposed on a base substrate; an isolating layer disposed on the first electrode; an active layer partly disposed on the isolating layer and electrically connected to the first electrode; a gate insulating layer configured to cover at least part of the active layer; a second electrode electrically connected to the active layer; and a gate electrode disposed on the gate insulating layer and located in a same layer with the second electrode.

An embodiment of the present disclosure further provides an array substrate including any of the TFTs provided by the embodiments of the present disclosure.

An embodiment of the present disclosure further provides a display panel including any of the array substrates provided by the embodiments of the present disclosure.

The TFT and the manufacturing method thereof provided by the embodiment of the present disclosure can mitigate the defects in the manufacturing process of vertical type TFT that the process steps are complicated and the alignment accuracy is poor. In the TFT and the manufacturing method thereof provided by the embodiment of the present disclosure, the gate electrode and the second electrode are formed by a single patterning process, which reduces the process steps, improves the production efficiency and lowers the cost. At the same time, the gate electrode and the second electrode are located in a same layer, which increases the alignment accuracy and improves the product yield. At the same time, the vertical type TFT effectively reduces the size of the TFT and improves the aperture ratio, thereby achieving the high resolution display.

Hereinafter, method(s), structure(s) and technical effect(s), to which the present disclosure concerns, will be described in more details through several embodiments.

FIG. 2 is a flow chart illustrating a manufacturing method of a TFT provided by an embodiment of the present disclosure. As illustrated in FIG. 2, the manufacturing method of the TFT includes steps as below.

S1, forming a first electrode, an isolating layer, an active layer and a gate insulating layer on a base substrate;

S2, simultaneously forming a second electrode and a gate electrode, wherein the second electrode is connected to the active layer.

For example, in an example, step S1 can further include:

S111, forming a first electrode on the base substrate;

S112, forming an isolating layer on the first electrode, wherein a side of the isolating layer adjacent to the active layer exposes a part of a surface of the first electrode;

S113, forming an active layer, wherein a first portion of the active layer is disposed on the isolating layer, and a second portion of the active layer is disposed on the base substrate and is connected to the part of the surface of the first electrode which is exposed;

S114, forming a gate insulating layer covering the first electrode, the isolating layer and the active layer, wherein the gate insulating layer is provided with a via hole.

For another example, in another example, step S1 can further include:

S121, forming a first electrode and an isolating layer on a base substrate, wherein a side of the isolating layer adjacent to the active layer exposes a part of a surface of the first electrode;

S122, forming an active layer, wherein a portion of the active layer is disposed on the isolating layer, and the other portion of the active layer is disposed on the base substrate and is connected to the part of the surface of the first electrode which is exposed;

S123, forming a gate insulating layer covering the first electrode, the isolating layer and the active layer, wherein the gate insulating layer is provided with a via hole.

For example, step S121 can further include:

depositing a first metallic film and coating an organic film on the base substrate;

exposing, in a stepped mode, and developing the organic film by using a halftone mask or a grey tone mask, to form an unexposed area at a location of the first electrode, to form a partly exposed area at a location of the data line, and to form a completely exposed area at the remaining location;

etching off the first metallic film in the completely exposed area to form the first electrode and the data line;

removing the organic film in the partly exposed area by ashing, to form the isolating layer which exposes a part of a surface of the first electrode.

For example, step S1 further includes a step of forming a buffer layer on the base substrate and then forming the first electrode on the buffer layer.

For example, step S2 can include:

S21, forming a metallic film on the gate insulating layer;

S22, forming the second electrode and the gate electrode located in a same layer by a single patterning process.

For example, an orthographic projection of the second electrode on the base substrate is overlapped with an orthographic projection of the first electrode on the base substrate; and the second electrode is connected to the active layer through the via hole in the gate insulating layer.

The term "patterning process" as used in the embodiments of the present disclosure includes steps such as depositing a film layer, coating a photoresist, exposing by using a mask, developing, etching and peeling off the photoresist, which belongs to mature technology. Depositing can be achieved by using well-known methods such as sputtering, evaporating and chemical vapor deposition; coating can be achieved by using well-known coating methods; and etching can be achieved by using well-known etching methods, without particularly limited herein.

FIGS. 3-8 are schematic diagrams illustrating a manufacturing method of a TFT provided by an embodiment of the present disclosure.

Figure 3:
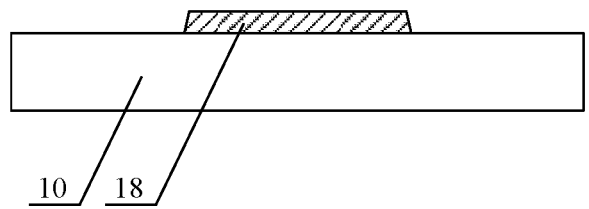
FIGS. 3-8 are schematic diagrams illustrating a manufacturing method of a thin film transistor provided by an embodiment of the present disclosure.

As illustrated in FIG. 3, providing a base substrate 10. In a first patterning process, forming a pattern of first electrode on the base substrate 10. Forming a pattern of first electrode includes: forming a first metallic film on the base substrate 10, for example, by using depositing method; coating a layer of photoresist on the first metallic film, exposing and developing the photoresist by using a monotone mask, to form an unexposed area at locations of patterns of first electrode and data line in which the photoresist is reserved, and to form a completely exposed area at the remaining location in which no photoresist is existed so as to expose the first metallic film; etching the first metallic film in the completely exposed area and peeling off the remaining photoresist to form the first electrode 18 and the data line (not illustrated). It should be explained that, for example, a data line (not illustrated) connected to a TFT used as a switching element of a pixel unit during usage can be formed along with the first electrode 18.

Figure 4:
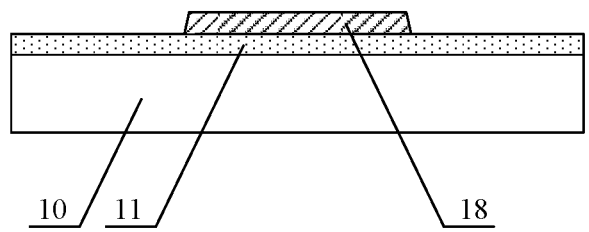

For example, the manufacturing method of a TFT provided by an embodiment of the present disclosure can further include: forming a buffer layer on the base substrate, the buffer layer is located between the first electrode and the base substrate. The buffer layer can be individually formed, and the pattern of first electrode can be formed later. Alternatively, as illustrated in FIG. 4, forming a buffer layer and a pattern of first electrode on the base substrate 10. Forming the buffer layer and the pattern of first electrode includes: sequentially forming a buffer layer and a first metallic film, for example, by depositing; coating a layer of photoresist on the first metallic film, exposing and developing the photoresist by using a monotone mask, to form an unexposed area at locations of patterns of the first electrode and the data line in which the photoresist is reserved, and to form a completely exposed area at the remaining location in which no photoresist is existed so as to expose the first metallic film; etching the first metallic film in the completely exposed area and peeling off the remaining photoresist to form the buffer layer 11, the first electrode 18 and the data line (not illustrated). It should be explained that, for example, a data line (not illustrated) connected to the TFT during usage can be formed along with the first electrode 18.

For example, the base substrate can adopt a glass substrate or a quartz substrate; the buffer layer can prevent ions in the base substrate from affecting the TFT, and can adopt a composite film of SiNx, SiOx or SiNx/SiOx; the first metallic film can adopt one or more selected from the group consisted of Pt, Ru, Au, Ag, Mo, Cr, Al, Ta, Ti and W.

Subsequent steps of the example illustrated in FIG. 4 are as same as those in FIG. 3. FIGS. 5-8 describe a manufacturing method of a TFT including a buffer layer, by way of example.

Figure 5:
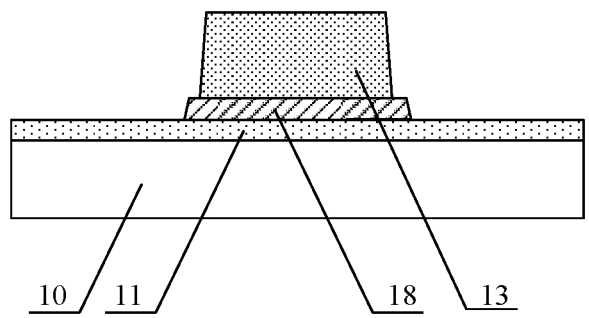

As illustrated in FIG. 5, in a second patterning process, forming an isolating layer 13 on the base substrate 10 formed with the first electrode 18 and the buffer layer 11. Forming the isolating layer 13 includes: coating an organic film onto the base substrate 10 formed with the first electrode 18 and the buffer layer 11, exposing and developing the organic film by using a monotone mask, to form an unexposed area at a location of a pattern of isolating layer in which the organic film can be reserved upon developing, and to form a completely exposed area at the remaining location in which the organic film can be removed (no organic film is existed) upon developing, so as to form the isolating layer 13 located on the first electrode 18. The isolating layer 13 is formed on the first electrode 18, and is configured to isolate and insulate the first electrode 18 from a subsequently formed second electrode, which helps to form a three-dimensional active layer. An orthographic projection of the isolating layer 13 on the base substrate 10 is at least partly overlapped with an orthographic projection of the first electrode 18 on the base substrate 10. For example, the orthographic projection of the isolating layer 13 has a width smaller than a width of the orthographic projection of the first electrode 18, and a side of the isolating layer 13 adjacent to the active layer exposes a part of a surface of the first electrode, so that at least one side of the isolating layer 13 exposes a part of a surface of the first electrode 18. For example, an end of the isolating layer 13 adjacent to the subsequently formed active layer exposes a part of a surface of the first electrode 18, and the part of the surface of the first electrode 18 that is exposed is used for electric connection with the active layer in subsequent process, so as to achieve the electric connection between the active layer and the first electrode 18.

For example, the isolating layer 13 can have a thickness in the range of 0.5 μm~2.0 μm. This thickness determines a channel length. During actual practice, for example, a width of the part of the surface of the first electrode that is exposed can be configured as 0.5 μm~1.5 μm. Of course, the thickness of the isolating layer 13 can be designed according to actual demands without particularly limited in the embodiment of the present disclosure. During actual practice, in the manufacturing method of TFT, a control accuracy of film thickness is superior to a control accuracy of pattern location, thus the TFT in the present embodiment is advantageous in longer channel and higher control accuracy.

Figure 6:
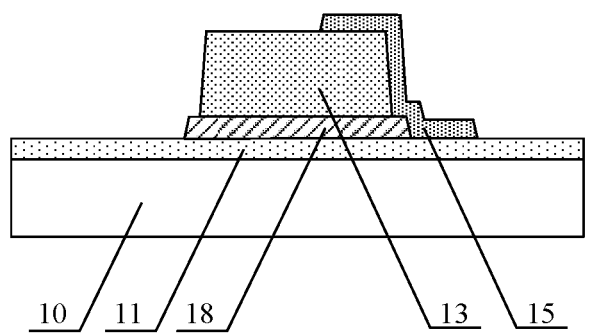

As illustrated in FIG. 6, in a third patterning process, forming an active layer 15 on the base substrate 10 formed with the isolating layer 13. Forming the active layer 15 includes: forming an active layer film on the base substrate formed with the above-mentioned structure(s), coating a layer of photoresist on the active layer film; exposing and developing the photoresist by using a monotone mask, to form an unexposed area at a location of a pattern of active layer in which the photoresist can be reserved, and to form a completely exposed area at other location in which no photoresist is existed so as to expose the active layer film; etching the active layer film in the completely exposed area and peeling off the remaining photoresist, so as to form the active layer 15. The active layer 15 includes a first portion and a second portion, the first portion of the active layer 15 is located on the isolating layer 13 to cover side surfaces and part of a top surface of the isolating layer 13; the second portion of the active layer 15 is located on the base substrate 10, for example, on the buffer layer 11, and is in direct contact with the part of the surface of the first electrode 18 which is exposed, so as to achieve the electric connection between the active layer 15 and the first electrode 18.

For example, the active layer can have a thickness in the range of 2000 Å-8000 Å; a material of the active layer can be amorphous silicon, polycrystalline silicon or microcrystalline silicon for forming a low temperature poly-silicon (LTPS) TFT, and can also be a metallic oxide material for forming a Oxide TFT; the metallic oxide material can be indium gallium zinc oxide (IGZO) or indium tin zinc oxide (ITZO).

Figure 7:
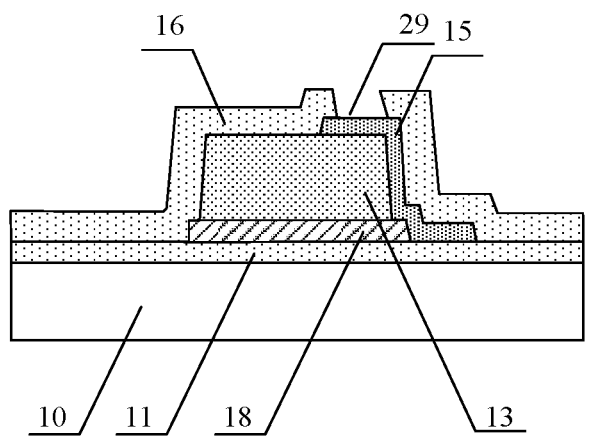

As illustrated in FIG. 7, in a fourth patterning process, forming a gate insulating layer 16 on the base substrate 10 formed with the active layer 15. Forming the gate insulating layer 16 includes: forming a gate insulating layer film on the base substrate 10 formed with the above-mentioned structure(s) by, for example, depositing or coating; coating a layer of photoresist on the gate insulating layer film, exposing and developing the photoresist by using a monotone mask, to form a completely exposed area at a location of a pattern of via hole in which no photoresist is existed so as to expose the gate insulating layer film, and to form an unexposed area at the remaining location in which the photoresist can be reserved; etching the gate insulating layer film in the completely exposed area and peeling off the remaining photoresist, so as to form the gate insulating layer 16 with a via hole 29. The gate insulating layer 16 covers at least part of the active layer 15 and the gate electrode 17. For example, in FIG. 7, the gate insulating layer 16 covers the first electrode 18, the isolating layer 13 and the active layer 15, and completely covers the base substrate. The via hole 29 exposes a part of the active layer 15 so that a subsequently formed second electrode is connected to the active layer through the via hole 29. For example, the gate insulating layer can adopt a composite film of SiNx, SiOx or SiNx/SiOx.

Figure 8:
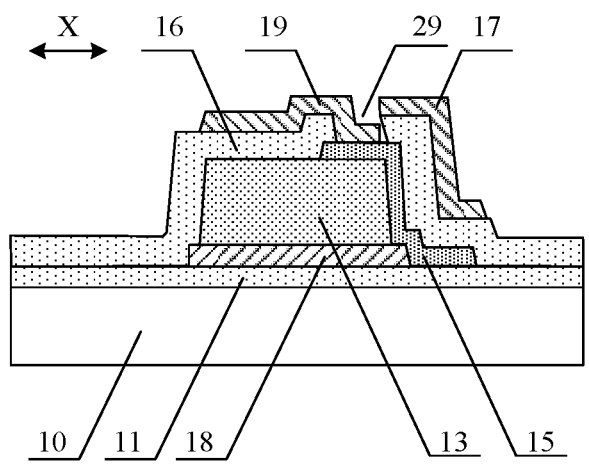

As illustrated in FIG. 8, in a fifth patterning process, simultaneously forming a second electrode 19 and a gate electrode 17 on the base substrate 10 formed with the gate insulating layer 16. Simultaneously forming the second electrode 19 and the gate electrode 17 includes: forming a second metallic film on the gate insulating layer 16 formed above by, for example, depositing or sputtering; coating a layer of photoresist on the second metallic film, exposing and developing the photoresist by using a monotone mask, to form an unexposed area at locations of second electrode 19 and gate electrode 17 in which the photoresist can be reserved, and to form a completely exposed area at the remaining location in which no photoresist existed so as to expose the second metallic film; etching the second metallic film in the completely exposed area and peeling off the remaining photoresist, so as to form the second electrode 19 and the gate electrode 17. The second electrode 19 and the gate electrode 17 are located in a same layer and are isolated from each other; furthermore, the second electrode 19 is connected to the active layer 15 through the via hole 29. In this way, a second electrode 19 and a gate electrode 17 located in a same layer can be formed by a single patterning process. For example, an orthographic projection of the second electrode 19 on the base substrate is partly overlapped with an orthographic projection of the first electrode 18 on the base substrate; an orthographic projection of the gate electrode 17 on the base substrate is partly overlapped with an orthographic projection of the active layer 15 on the base substrate. Of course, in other embodiments, an orthographic projection of the second electrode 19 on the base substrate is overlapped with an orthographic projection of the first electrode 18 on the base substrate; and an orthographic projection of the gate electrode 17 on the base substrate is overlapped with an orthographic projection of the active layer 15 on the base substrate. For example, the second metallic film can adopt one or more selected from the group consisted of Pt, Ru, Au, Ag, Mo, Cr, Al, Ta, Ti and W.

Figure 9:
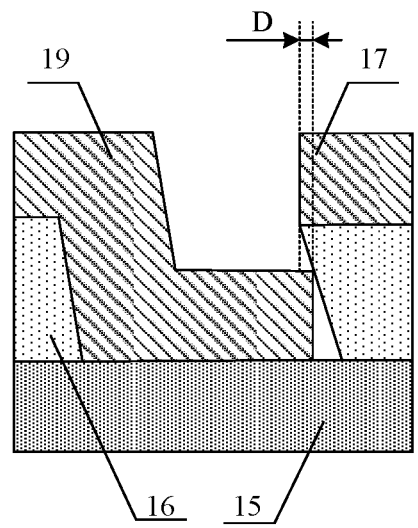
FIG. 9 is a schematic diagram illustrating a positional relationship between a gate electrode and a second electrode in an embodiment of the present disclosure.

For example, in the fourth patterning process of the above embodiment, forming the gate insulating layer having the via hole further includes: forming a bottom kerve at a location where the gate electrode is disconnected from the second electrode by way of undercut. The bottom kerve allows orthographic projections of the simultaneously formed gate electrode and second electrode on the base substrate to be partly overlapped with each other, so as to prevent from any gap between the gate electrode and the second electrode, which gap makes it impossible to form a gate controlling channel FIG. 9 is a schematic diagram illustrating a positional relationship between a gate electrode and a second electrode in an embodiment of the present disclosure. As illustrated in FIG. 9, for example, during etching the gate insulating layer film in the completely exposed area in the fourth patterning process, the bottom kerve is formed in a side wall of the via hole adjacent to the gate electrode by using the way of undercut or by means of over etching. During practical manufacture, two side walls of the via hole can have different appearances by means of gray level exposure, wherein the side wall adjacent to the gate electrode is provided with a undercut structure while the other one has a conventional structure.

In a fifth patterning process, the gate electrode and the second electrode that are located in a same layer are disconnected from each other at the bottom kerve of the via hole. An end of the gate electrode adjacent to the second electrode is located on the gate insulating layer which is outside the via hole, and an end of the second electrode adjacent to the gate electrode is located in the via hole and extending to the side wall of the bottom kerve, so that an orthographic projection of the gate electrode on the base substrate is partly overlapped with an orthographic projection of the second electrode on the base substrate. For example, the overlapped area has a width of D which is in the range of 0-3000 Å. During practical implementation, the width D of the overlapped area can be configured as 0 by a structural design of the via hole and the bottom kerve; that is, a location of an orthographic projection of the end of gate electrode adjacent to the second electrode on the base substrate is in contact with a location of an orthographic projection of the end of the second electrode adjacent to the gate electrode on the base substrate. In other words, an orthographic projection of an edge of the gate electrode close to the second electrode on the base substrate is substantially overlapped with an orthographic projection of an edge of the second electrode close to the gate electrode on the base substrate.

By designing a location of the gate electrode and the second electrode, the present embodiment prevents from a gap between the gate electrode and the second electrode which makes it impossible to form a gate controlling channel, so as to improve the electric performance of the TFT.

In the embodiments of the present disclosure, the "width" refers to a feature size perpendicular to an extending direction of the data line or the electrode. As a result, the width of the orthographic projection of the gate electrode (second electrode, active layer, isolating layer or first electrode) on the base substrate refers to a feature size of a cross section of the gate electrode (second electrode, active layer, isolating layer or first electrode) in a direction (the X direction as illustrated in FIG. 8) perpendicular to the extending direction of the data line. Additionally, in the present embodiment, "overlapped with" refers to orthographic projections of two patterns on the base substrate have the same scope; that is, the orthographic projections of the two patterns on the base substrate have the same width; or, a range of an orthographic projection of one pattern on the base substrate is located in a range of an orthographic projection of the other pattern on the base substrate, that is, the orthographic projection of one pattern on the base substrate has a width smaller than that of the orthographic projection of the other pattern on the base substrate. "partly overlapped with" refers to a range of an orthographic projection of one pattern on the base substrate is partly overlapped with a range of an orthographic projection of the other pattern on the base substrate.

As it can be seen from the manufacturing method of TFT as illustrated in FIGS. 3-8, the present embodiment forms a vertical type TFT having six film layers through total five patterning processes using conventional masks. As compared with the case where the vertical type TFT has seven film layers and requires for total six patterning processes, the technical process is simplified by one film layer and one patterning process, so as to improve the product efficiency and reduce the cost. At the same time, the gate electrode and the second electrode are located in the same layer, with higher alignment accuracy and improved product yield. Further, the vertical type TFT is effectively reduced in its size, which increases the aperture ratio and achieves the high resolution display.

In the manufacturing process of TFT, a channel usually involves damage during etching. The manufacturing method provided in the present embodiment eliminates an etching process of channel, and hence remove the problem of channel damage. Furthermore, the vertical type TFT as manufactured has relatively higher channel uniformity. A channel length is determined by a thickness of the isolating layer, thus an improved control accuracy of the channel length also improves the performance of the TFT. The TFT has a vertical structure as a whole, but each film layer is provided with a horizontal coverage structure to compensate for the poor coverage area in the vertical direction. For example, a portion of the active layer is horizontally disposed on the isolating layer, another portion is horizontally disposed on the buffer layer, and a middle portion is in contact with the surface of the first electrode. For another example, a portion of the gate electrode is horizontally disposed on the gate insulating layer, and the other portion is horizontally disposed on the buffer layer. Currently, a high precision exposure device in an order of 0.5 µm can be utilized to manufacture film layers of the vertical type TFT in the present embodiment.

For example, in the manufacturing method of TFT provided by an embodiment of the present disclosure, the first electrode and the isolating layer can be formed by a same patterning process, which facilitates simplifying the manufacturing process and improving the product efficiency. FIGS. 10-13 are schematic diagrams of forming an isolating layer and a first electrode through a same patterning process in an embodiment of the present disclosure. The manufacturing method illustrated in FIGS. 10-13 are characterized by that the first electrode and the isolating layer are formed by a single patterning process. For example, in this manufacturing method, the data line can also be formed along with the first electrode. For example, in FIGS. 10-13, a left portion of each figure illustrates a location of TFT and a right portion of each figure illustrates a location of data line.

Figure 10:
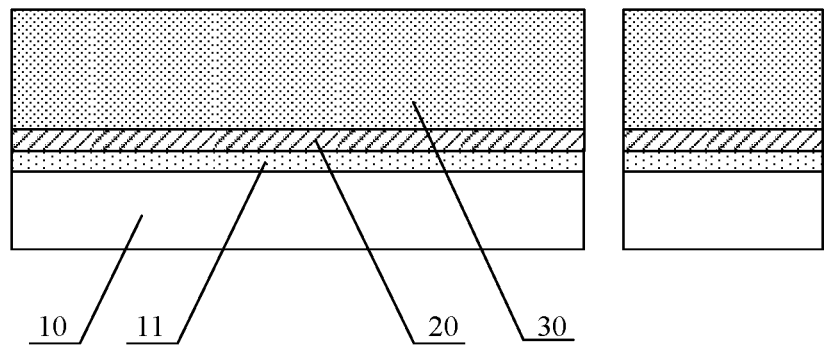
FIGS. 10-13 are schematic diagrams of forming an isolating layer and a first electrode through a same patterning process in an embodiment of the present disclosure.

For example, in a first patterning process, forming a pattern of buffer layer, first electrode and isolating layer on a base substrate. As illustrated in FIG. 10, depositing a buffer layer 11 on a base substrate 10. A data line is formed along with the first electrode and the isolating layer by a same process, including: forming a first metallic film 20 on the buffer layer 11, and coating an organic film 30 on the first metallic film 20.

Figure 11:
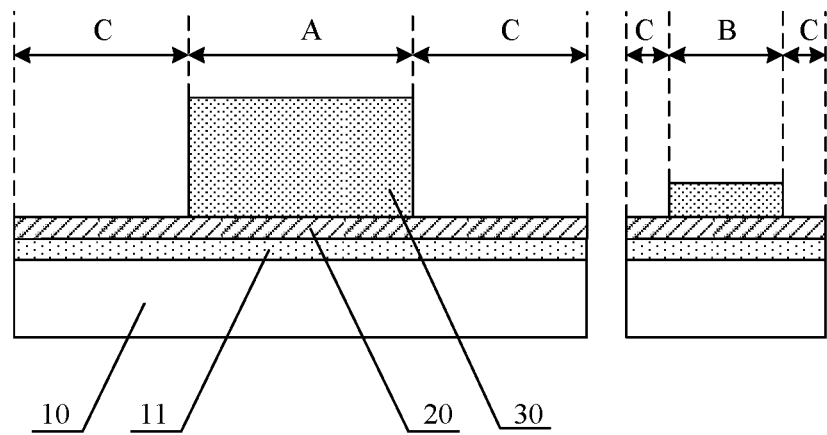

As illustrated in FIG. 11, exposing, in a stepped mode, and developing the organic film by using a halftone mask or a grey tone mask, to form an unexposed area A at a location of first electrode in which an organic film with a first thickness is reserved; to form a partly exposed area B at a location of data line in which an organic film with a second thickness is reserved; and to form a completely exposed area C at the remaining location in which no organic film is existed so as to expose the first metallic film 20; wherein the first thickness is greater than the second thickness.

Figure 12:
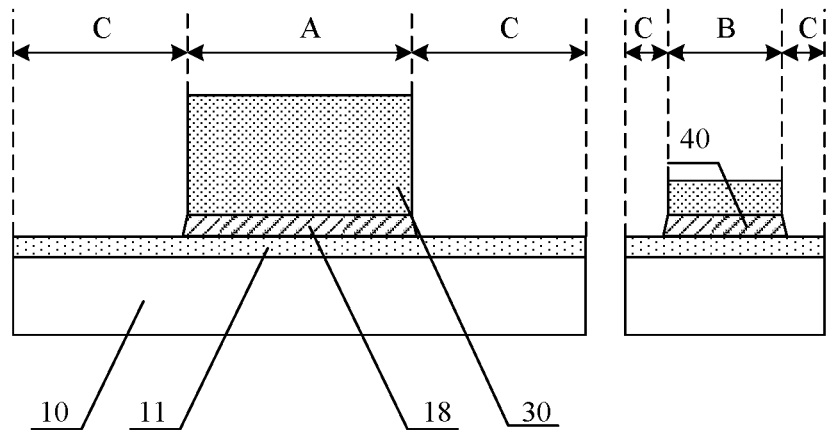

As illustrated in FIG. 12, etching off the first metallic film in the completely exposed area C to form the first electrode 18 and the data line 40.

Figure 13:
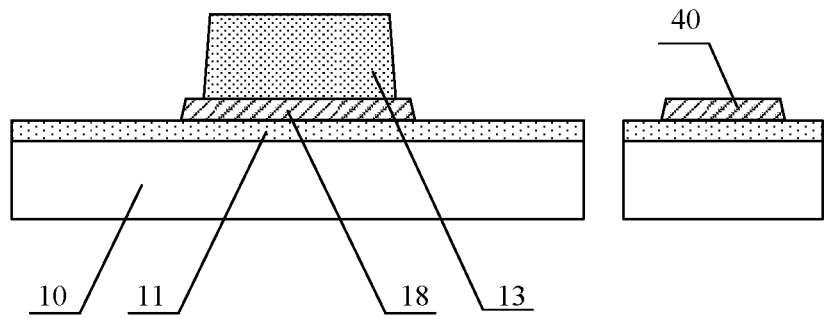

As illustrated in FIG. 13, ashing the organic film to remove the portion having the second thickness from the organic film, that is, removing the organic film in the partly exposed area B, so as to form a pattern of isolating layer 13 which is located on the first electrode 18 and exposes a part of a surface of the first electrode 18 and also the surface of the data line 40. During ashing process, with the decrease of the entire thickness of the organic film, a size of the pattern of isolating layer 13 on the first electrode 18 is reduced; as a result, after the ashing process, an orthographic projection of the isolating layer 13 on the base substrate is overlapped with an orthographic projection of the first electrode 18 on the base substrate, but a width of the orthographic projection of the isolating layer 13 on the base substrate is smaller than a width of the orthographic projection of the first electrode 18 on the base substrate, so as to expose a part of the surface of the first electrode 18.

In a second patterning process, forming an active layer on the base substrate formed with the isolating layer, as illustrated in FIG. 6. In the embodiment illustrated in FIGS. 10-13, a subsequent second patterning process is as same as the third patterning process in the embodiment illustrated in FIG. 6 without repeating herein.

In a subsequent third patterning process of the embodiment illustrated in FIGS. 10-13, forming a gate insulating layer on the base substrate formed with the active layer. The third patterning process of the embodiment illustrated in FIGS. 10-13 is as same as the fourth patterning process of the embodiment illustrated in FIG. 7 without repeating herein.

In a subsequent fourth patterning process of the embodiment illustrated in FIGS. 10-13, simultaneously forming a pattern of second electrode and gate electrode on the base substrate formed with the gate insulating layer. The fourth patterning process of the present embodiment is as same as the fifth patterning process of the embodiment illustrated in FIG. 8 without repeating herein.

As it can be seen from the manufacturing method of TFT illustrated in FIGS. 10-13, the present embodiment forms a vertical type TFT having six film layers through total four patterning processes. The four patterning processes include three patterning processes using conventional masks and one patterning process using a halftone mask or grey tone mask. In the present embodiment, parameter(s) such as material and thickness of respective film layers can be as same as that in the first embodiment, and the structure of the vertical type TFT as obtained is as same as that in the first embodiment. The vertical type TFT as manufactured in the present embodiment not only possesses the advantage(s) of the first embodiment but also reduces the number of patterning processes by one, so as to simplify the technical process as far as possible, and hence to improve the product efficiency and reduce the cost.

Figure 14:
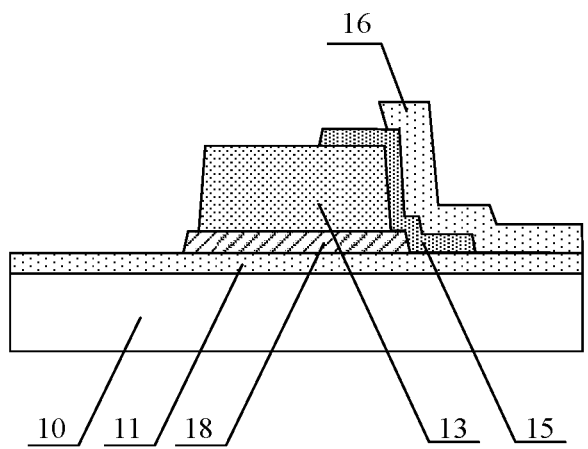
FIGS. 14-15 are schematic diagrams illustrating another manufacturing method of a thin film transistor provided by an embodiment of the present disclosure.
Figure 15:
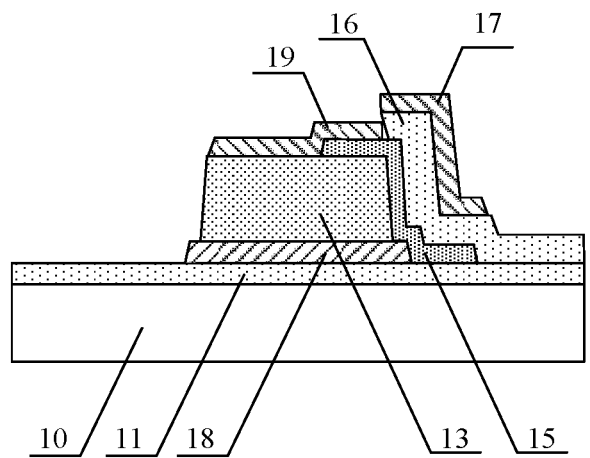

FIGS. 14-15 are schematic diagrams illustrating another manufacturing method of a thin film transistor provided by an embodiment of the present disclosure. The method in the present embodiment differs from the embodiment illustrated in FIGS. 4-8 in that: a side of the gate insulating layer as formed close to the isolating layer exposes a part of a surface of the active layer, and the second electrode is in direct contact with the part of the surface of the active layer which is exposed, so as to achieve an electric connection between the second electrode and the active layer.

A first to third patterning process of the embodiment illustrated in FIGS. 14-15 are as same as that in FIGS. 4-6, and reference can be made to the same. As illustrated in FIG. 14, in a fourth patterning process, based on the structure illustrated in FIG. 6, forming a gate insulating layer film on the base substrate 10 by depositing or coating; coating a layer of photoresist on the gate insulating layer film, exposing and developing the photoresist by using a monotone mask, to form a completely exposed area at a location of pattern of via hole in which no photoresist is existed so as to expose the gate insulating layer film, and to form an unexposed area at the remaining location in which the photoresist is reserved; etching the gate insulating layer film in the completely exposed area and peeling off the remaining photoresist, so as to form the gate insulating layer 16 partly covering the active layer, and a side of the gate insulating layer 16 close to the isolating layer exposes a part of the surface of the active layer so as to be directly contacted with the subsequently formed second electrode.

For example, in the fourth patterning process illustrated in FIG. 14, when etching the gate insulating layer film in the completely exposed area, a structure with a profile shape illustrated in FIG. 14 can also be formed on a side of the gate insulating layer adjacent to the second electrode by means of undercut or over etching. In this way, orthographic projections of the simultaneously formed gate electrode and second electrode on the base substrate are partly overlapped with each other, so as to prevent from any gap between the gate electrode and the second electrode, which gap makes it impossible to form a gate controlling channel. Detailed description may be as same as that of the side wall of the via hole 29 close to the gate electrode in conjunction with FIG. 9, and reference may be made thereto.

As illustrated in FIG. 15, in a fifth patterning process, simultaneously forming a second electrode 19 and a gate electrode 17 on the base substrate 10 formed with the gate insulating layer 16, including: forming a second metallic film on the above-mentioned gate insulating layer 16 and active layer 15 by, for example, depositing or sputtering; coating a layer of photoresist on the second metallic film, exposing and developing the photoresist by using a monotone mask, to form an unexposed area at locations of a second electrode 19 and a gate electrode 17 in which the photoresist is reserved, and to form a completely exposed area at the remaining location in which no photoresist is existed so as to expose the second metallic film; etching the second metallic film in the completely exposed area and peeling off the remaining photoresist to form the second electrode 19 and the gate electrode 17 which are located in a same layer and are isolated from each other. The second electrode 19 is in direct contact with the part of the surface of the active layer which is exposed, so as to achieve an electric connection between the second electrode and the active layer.

It should be explained that, the expression "in a same layer" in the embodiments of the present disclosure refers to that the structures as obtained are simultaneously formed through a same process, rather than having a same height with reference to the base substrate.

Figure 16:
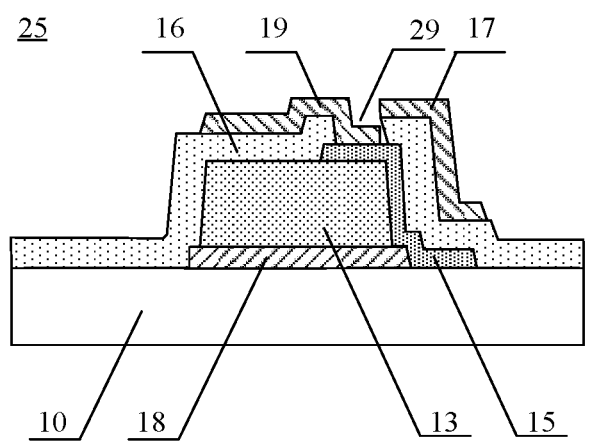
FIG. 16 is a structural diagram illustrating a thin film transistor provided by an embodiment of the present disclosure.

FIG. 16 is a structural diagram illustrating a thin film transistor provided by an embodiment of the present disclosure. As illustrated in FIG. 16, the TFT 25 includes a first electrode 18, an isolating layer 13, an active layer 15, a gate insulating layer 16, a second electrode 19, and a gate electrode 17. The first electrode 18 is disposed on the base substrate 10. The isolating layer 13 is disposed on the first electrode 18 and is located between the first electrode 18 and the second electrode 19 so as to isolate and insulate the first electrode 18 from the second electrode 19. For example, the gate insulating layer 6 covers the first electrode 18, the isolating layer 13, the active layer 15 and the gate electrode 17; the gate insulating layer 16 is provided with a via hole 29 through which the second electrode 19 is connected to the active layer 15 so as to achieve the electric connection between the second electrode 19 and the active layer 15. The gate electrode 17 is disposed on the gate insulating layer 16 and is located in a same layer with the second electrode 19.

For example, an orthographic projection of the isolating layer 13 on the base substrate 10 has a width smaller than a width of an orthographic projection of the first electrode 18 on the base substrate 10, and a side of the isolating layer 13 adjacent to the active layer 15 exposes a part of a surface of the first electrode 18. The active layer 15 is connected to the part of the surface of the first electrode 18 which is exposed. For example, the active layer 15 includes a first portion and a second portion, the first portion is disposed on the isolating layer 13, and the second portion is disposed on the base substrate 10 and is connected to the part of the surface of the first extrude 18 which is exposed from the isolating layer 13, so as to achieve an electric connection between the active layer 15 and the first electrode 18.

In the embodiment of the present disclosure, the gate electrode and the second electrode are located in a same layer and are formed through a single patterning process. The first electrode, the active layer and the second electrode are sequentially stacked to form a vertical type TFT in which a channel region is perpendicular to a surface of the base substrate. For example, during operating the TFT, a data line (not illustrated) connected to the TFT can be located in a same layer with the first electrode; the gate line and the gate electrode can be in a same layer. During practical implementation, for example, the first electrode can be used as a source electrode while the second electrode can be used as a drain electrode; or, the first electrode can be used as a drain electrode while the second electrode can be used as a source electrode, without particularly limited herein. For example, the gate insulating layer can cover the first electrode, the isolating layer and the active layer; and can also cover the entire base substrate; the via hole in the gate insulating layer is located at a location of the active layer on the isolating layer.

For example, the isolating layer has a thickness in the range of 0.5 μm~2.0 μm. An orthographic projection of the isolating layer on the base substrate is overlapped with an orthographic projection of the first electrode on the base substrate, and the orthographic projection of the isolating layer on the base substrate has a width smaller than a width of the orthographic projection of the first electrode on the base substrate, so that the side of the isolating layer adjacent to the active layer exposes a part of a surface of the first electrode.

For example, the active layer has a thickness in the range of 2000 Å-8000 Å; a material of the active layer can include amorphous silicon, polycrystalline silicon, oxide semiconductor and the like, so as to form a low temperature poly-silicon (LTPS) TFT or an Oxide TFT.

For example, an orthographic projection of the second electrode 19 on the base substrate 10 is partly overlapped with an orthographic projection of the first electrode 18 on the base substrate; for example, the orthographic projection of the second electrode 19 has a width smaller than a width of the orthographic projection of the first electrode 18. An orthographic projection of the gate electrode 17 on the base substrate 10 is partly overlapped with an orthographic projection of the active layer 15 on the base substrate 10; for example, the orthographic projection of the gate electrode 17 has a width smaller than a width of the orthographic projection of the active layer 15. The orthographic projection of the gate electrode 17 on the base substrate 10 is partly overlapped with the orthographic projection of the second electrode 19 on the base substrate 10. The overlapped area has a width of D, for example, D=0~3000 Å. For example, an orthographic projection of an edge of the gate electrode close to the second electrode on the base substrate is substantially overlapped with an orthographic projection of an edge of the second electrode close to the gate electrode on the base substrate; in such case, the width D of the overlapped area is zero. Of course, the range of D is not particularly limited in the embodiment of the present disclosure.

Figure 17:
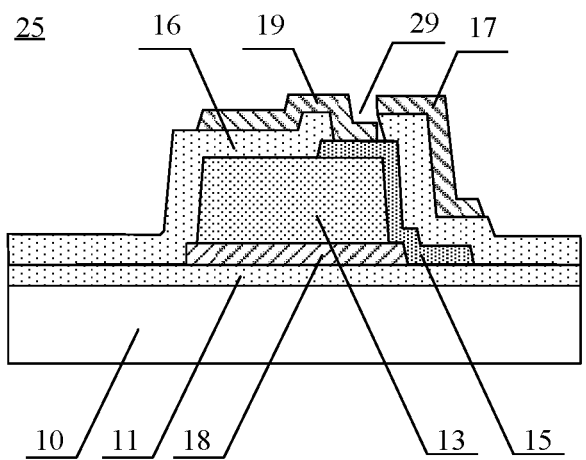
FIG. 17 is a structural diagram illustrating another thin film transistor provided by an embodiment of the present disclosure.

FIG. 17 is a structural diagram illustrating another thin film transistor provided by an embodiment of the present disclosure. The TFT as illustrated in FIG. 17 differs from the TFT illustrated in FIG. 16 in that it further includes a buffer layer 11. The buffer layer 11 is disposed on the base substrate 10, and the first electrode is disposed on the buffer layer; that is, the buffer layer is located between the base substrate 10 and the first electrode 18. The buffer layer can prevent ions in the base substrate from affecting the TFT. A material of the buffer layer can be referred to the above, without repeating herein. Other structures of the TFT illustrated in FIG. 17 are as same as those illustrated in FIG. 16, and reference may be made thereto.

Figure 18:
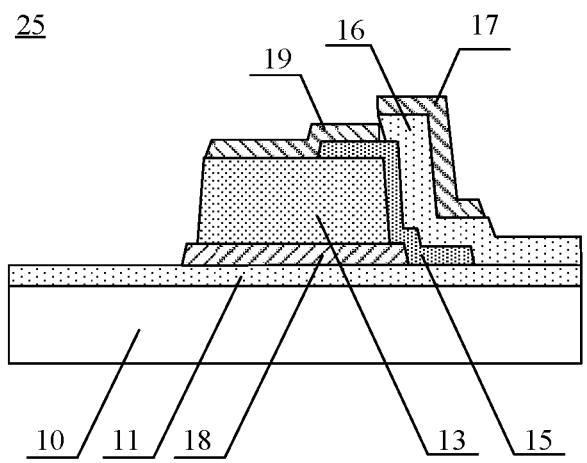
FIG. 18 is a structural diagram illustrating still another thin film transistor provided by an embodiment of the present disclosure.

FIG. 18 is a structural diagram illustrating still another thin film transistor provided by an embodiment of the present disclosure. The TFT as illustrated in FIG. 18 differs from the TFT illustrated in FIG. 17 in that, a side of the gate insulating layer 16 close to the isolating layer 13 exposes a part of a surface of the active layer 15, and the second electrode 19 is in direct contact with the part of the surface of the active layer 15 which is exposed, so as to achieve the electric connection between the second electrode 19 and the active layer 15. Other structures of the TFT illustrated in FIG. 18 are as same as those illustrated in FIG. 17, and reference may be made thereto.

Figure 19:
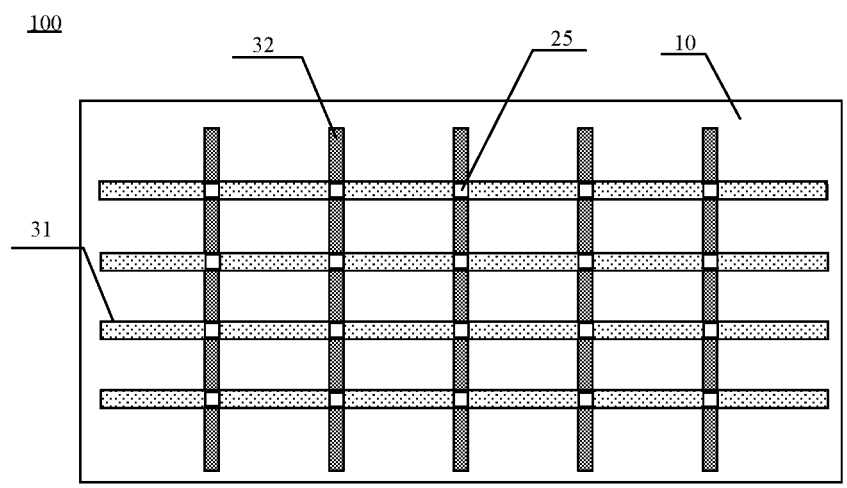
FIG. 19 is a schematic diagram illustrating an array substrate provided by an embodiment of the present disclosure.

FIG. 19 is a schematic diagram illustrating an array substrate provided by an embodiment of the present disclosure. As illustrated in FIG. 19, the array substrate 100 further includes a gate line 31, a data line 32 and a plurality of pixel units defined by the gate line 31 and the data line 32 intersected with each other. For example, a TFT 25 is disposed at a location where the gate line 31 and the data line 32 are intersected with each other, so as to be used as a switching element of the pixel unit, in which a gate electrode is electrically connected to the gate line, and a source or drain electrode is electrically connected to the data line while a drain or a source electrode is electrically connected to a pixel electrode, correspondingly.

An embodiment of the present disclosure further provides an array substrate including any of the array substrates provided by embodiments of the present disclosure. A manufacturing process of the array substrate 101 includes: forming a gate line 31, a data line 32 and a TFT 25 on the base substrate 10. The TFT can be formed by using any of the manufacturing methods provided by embodiments of the present disclosure. The data line 32 can be formed along with the first electrode of the TFT by means of any of the methods described above.

For example, the manufacturing method of the array substrate 101 further includes: depositing a passivation layer on the base substrate 10 formed with the TFT 25; coating a layer of photoresist on the passivation layer, exposing and developing the photoresist by using a monotone mask, etching the passivation layer and peeling off the remaining photoresist to form a pattern of via hole in the passivation layer at a location of the second electrode. For example, the passivation layer can adopt a composite film of SiNx, SiOx or SiNx/SiOx.

Depositing a transparent conductive film on the passivation layer, and coating a layer of photoresist on the transparent conductive film, exposing and developing the photoresist by using a monotone mask; etching the transparent conductive film and peeling off the remaining photoresist to form a pixel electrode which is connected to the second electrode through the via hole in the passivation layer. For example, the transparent conductive film can adopt a composite film of ITO, IZO, ITO/Ag/ITO.

In the array substrate provided by the embodiment of the present disclosure, the gate electrode and the second electrode are located in a same layer and are formed through a single patterning process. The first electrode, the active layer and the second electrode are sequentially stacked to form a vertical type TFT in which a channel region is perpendicular to a surface of the base substrate. The gate line and the gate electrode are in a same layer; the data line and the first electrode are in a same layer. When applying a scanning signal on the gate line (gate electrode), the active layer adjacent to a side of the gate electrode forms a current pass which conducts the first electrode and the second electrode which are connected through the active layer, so as to turn on the TFT; then a gray-level signal applied on a data signal line is applied onto the pixel electrode through the first electrode, the current pass formed in the active layer and the second electrode. During practical implementation, the channel length can be adjusted by controlling the thickness of the isolating layer so as to increase an amount of conduction current of the TFT and to improve the performance of the TFT.

In the array substrate provided by the present embodiment, the gate electrode and the second electrode are formed through a single patterning process, which simplifies the process steps, improves the production efficiency and reduces the cost; the gate electrode and the second electrode are located in a same layer, which increases the alignment accuracy and improves the product yield. At the same time, the vertical type TFT effectively reduces a dimension of the TFT, increases the aperture ratio, and hence achieves the high resolution display.

Figure 20:
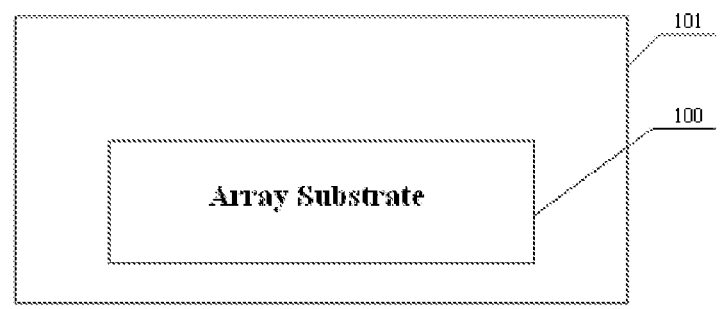
FIG. 20 is a schematic diagram illustrating a display panel provided by an embodiment of the present disclosure.

An embodiment of the present disclosure further provides a display panel including any of the array substrates provided by the embodiments of the present disclosure. FIG. 20 is a schematic diagram illustrating a display panel provided by an embodiment of the present disclosure. FIG. 20 only illustrates structure(s) correlated with the array substrate 100, and other structure(s) may be referred to conventional technologies in the art.

For example, the display panel 101 can be any product or component having display function such as a mobile phone, a tablet computer, a television, a displayer, a notebook computer, a digital photo frame and a navigation device. The display panel 101 can be a liquid crystal display (LCD) panel, or an organic light-emitting diode display (OLED) panel, or other organic electroluminescence devices.

The above are merely specific implementations of the present disclosure without limiting the protection scope of the present disclosure thereto. The protection scope of the present disclosure should be based on the protection scope of the appended claims.

What is claimed is:

1. A manufacturing method of a thin film transistor (TFT), comprising:
    providing a base substrate;
    forming a first electrode, an isolating layer, an active layer and a gate insulating layer on the base substrate;
    simultaneously forming a second electrode and a gate electrode,
    wherein the second electrode is connected to the active layer.

2. The manufacturing method of a TFT according to claim 1, wherein the isolating layer is formed on the first electrode, and is configured to isolate and insulate the first electrode from the second electrode.

3. The manufacturing method of a TFT according to claim 1, wherein an orthographic projection of the isolating layer on the base substrate has a width smaller than a width of an orthographic projection of the first electrode on the base substrate, and a side of the isolating layer adjacent to the active layer exposes a part of a surface of the first electrode.

4. The manufacturing method of a TFT according to claim 3, wherein the active layer comprises a first portion and a second portion, wherein the first portion is on the isolating layer, and the second portion is on the base substrate and is connected to the part of the surface of the first electrode which is exposed.

5. The manufacturing method of a TFT according to claim 1, wherein the gate insulating layer is formed to cover at least part of the active layer and the gate electrode.

6. The manufacturing method of a TFT according to claim 5, wherein
    the gate insulating layer is formed to cover the first electrode and the isolating layer; and
    the gate insulating layer is provided with a via hole through which the second electrode is connected to the active layer.

7. The manufacturing method of a TFT according to claim 5, wherein a side of the gate insulating layer close to the isolating layer exposes a part of a surface of the active layer, and the second electrode is in direct contact with the part of the surface of the active layer which is exposed.

8. The manufacturing method of a TFT according to claim 1, wherein simultaneously forming a second electrode and a gate electrode comprises:
    forming a second metallic film on the gate insulating layer and the active layer; and
    forming the second electrode and the gate electrode in a same layer by a single patterning process.

9. The manufacturing method of a TFT according to claim 8, wherein
    an orthographic projection of the second electrode on the base substrate is at least partly overlapped with an orthographic projection of the first electrode on the base substrate;
    an orthographic projection of the gate electrode on the base substrate is at least partly overlapped with an orthographic projection of the active layer on the base substrate; and
    the orthographic projection of the gate electrode on the base substrate is partly overlapped with the orthographic projection of the second electrode on the base substrate.

10. The manufacturing method of a TFT according to claim 9, wherein an orthographic projection of an edge of the gate electrode close to the second electrode on the base substrate is substantially overlapped with an orthographic projection of an edge of the second electrode close to the gate electrode on the base substrate.

11. The manufacturing method of a TFT according to claim 1, wherein the first electrode and the isolating layer are formed by a same, single patterning process.

12. The manufacturing method of a TFT according to claim 11, wherein the data line, the first electrode and the isolating layer are formed by a same process, comprising:
    forming a first metallic film and an organic film on the base substrate;
    exposing, in a stepped mode, and developing the organic film by using a halftone mask or a grey tone mask to form an unexposed area at a location to be formed with the first electrode, to form a partly exposed area at a location to be formed with the data line, and to form a completely exposed area at the remaining location;
    removing the first metallic film in the completely exposed area by etching so as to form the first electrode and the data line; and
    removing the organic film in the partly exposed area and the organic film in the unexposed area by ashing, so as to form the isolating layer.

13. The manufacturing method of a TFT according to claim 1, wherein the isolating layer has a thickness in the range of 0.5 µm~2.0 µm.

14. The manufacturing method of a TFT according to claim 1, further comprising:
forming a buffer layer on the base substrate, wherein the buffer layer is between the first electrode and the base substrate.

15. A thin film transistor (TFT), comprising:
a first electrode on a base substrate;
an isolating layer on the first electrode;
an active layer connected to the first electrode;
a gate insulating layer configured to cover at least part of the active layer;
a second electrode electrically connected to the active layer; and
a gate electrode on the gate insulating layer, the gate electrode and the second electrode being in a same layer.

16. The TFT according to claim 15, wherein
the gate insulating layer is configured to further cover the first electrode and the isolating layer; and
the gate insulating layer is provided with a via hole through which the second electrode is connected to the active layer.

17. The TFT according to claim 15, wherein a side of the gate insulating layer close to the isolating layer exposes a part of a surface of the active layer, and the second electrode is in direct contact with the part of the surface of the active layer which is exposed.

18. The TFT according to, wherein
an orthographic projection of the isolating layer on the base substrate has a width smaller than a width of an orthographic projection of the first electrode on the base substrate, a side of the isolating layer adjacent to the active layer exposes a part of a surface of the first electrode, and the active layer is connected to the part of the surface of the first electrode which is exposed.

19. The TFT according to claim 18, wherein the active layer comprises a first portion and a second portion, wherein
the first portion is on the isolating layer, and the second portion is on the base substrate and is connected to the part of the surface of the first electrode which is exposed from the isolating layer.

20. An array substrate, comprising the TFT according to claim 15.

* * * * *